US005563517A

United States Patent [19]

Biery et al.

[11] Patent Number: 5,563,517
[45] Date of Patent: Oct. 8, 1996

[54] DUAL CHANNEL D.C. LOW NOISE MEASUREMENT SYSTEM AND TEST METHODOLOGY

[75] Inventors: Glenn A. Biery, Poughkeepsie; Daniel M. Boyne, Wappingers Falls; Kenneth P. Rodbell, Poughquag; Richard G. Smith, Poughkeepsie; Michael H. Wood, Hopewell Junction, all of N.Y.

[73] Assignee: International Business Machines Corporation, Armonk, N.Y.

[21] Appl. No.: 442,556

[22] Filed: May 16, 1995

Related U.S. Application Data

[62] Division of Ser. No. 970,370, Nov. 2, 1992, Pat. No. 5,434,385.
[51] Int. Cl.⁶ .................................................. G01R 29/26
[52] U.S. Cl. ............................ 324/613; 324/520; 324/537
[58] Field of Search ....................................... 324/501, 520, 324/537, 538, 612, 613, 614

[56] References Cited

U.S. PATENT DOCUMENTS

| | | | |
|---|---|---|---|
| 3,639,703 | 2/1972 | Bergemann et al. | 324/76.31 |
| 4,275,348 | 6/1981 | Bayer et al. | 324/615 |
| 4,331,285 | 5/1982 | Gottwals . | |
| 4,483,629 | 11/1984 | Schwarz et al. . | |
| 4,554,608 | 11/1985 | Block . | |
| 4,570,156 | 2/1986 | Nicholas, Jr. . | |
| 4,739,258 | 4/1988 | Schwarz . | |
| 4,864,218 | 9/1989 | Leake et al. | 324/613 |
| 4,899,289 | 2/1990 | Appel | 324/76.22 X |
| 4,949,031 | 8/1990 | Szasz et al. . | |
| 4,978,914 | 12/1990 | Akimoto et al. . | |
| 4,991,051 | 2/1991 | Hung . | |
| 4,992,624 | 2/1991 | Benson et al. . | |
| 4,998,071 | 3/1991 | Strid et al. | 324/613 |
| 5,045,637 | 9/1991 | Sato et al. . | |
| 5,045,638 | 9/1991 | Wada et al. . | |
| 5,049,811 | 9/1991 | Dreyer et al. . | |
| 5,057,441 | 10/1991 | Gutt et al. . | |

FOREIGN PATENT DOCUMENTS

| | | |
|---|---|---|
| 0484013 | 5/1992 | European Pat. Off. . |
| 63-156331 | 6/1988 | Japan . |

OTHER PUBLICATIONS

"Minimization of Low Frequency Noise Sources In Electronic Measurements"; B. Pellegrini et al.; Instituto di Elettronica e Telecomunicazioni and Centro di Studio; pp. 195–200; Jun. 1986.

"Electromigration and Low–Frequency Resistance Fluctuations in Aluminum Thin–Film Interconnections"; Bruno Neri et al.; IEEE; Nov. 1987; pp. 2317–2322.

"An Automated Noise Measurement System for Packaged VLSI Metal Thin Films"; G. M. Gutt et al.; Univ. of South Florida; Apr. 1989 Southeastcon; pp. 1305–1309.

(List continued on next page.)

*Primary Examiner*—Kenneth A. Wieder
*Assistant Examiner*—Glenn W. Brown
*Attorney, Agent, or Firm*—Whitham, Curtis, Whitham & McGinn; Charles W. Peterson, Jr.

[57] ABSTRACT

A test system having an improved physical layout and electrical design allows the 1/f noise of metal interconnects to be measured at levels close to that of Johnson or thermal noise. A detailed description of examples of operation of the test system provides evidence of the effectiveness of the test system in minimizing system noise to a level significantly lower than Johnson noise. This permits quantitative measurement of the noise contribution attributable to variations in cross-sectional area of connections for various applications and for qualitative prediction of electromigration lifetimes of metal films, particularly aluminum, having different microstructures. The test system includes an enclosure which includes several nested groups of housings including a sample oven within a device under test box which is, in turn, contained within the system enclosure. Wire wound resistors powered by a DC power supply are used to provide heating without interfering with measurement of 1/f noise of a device under test (D.U.T.). A biasing circuit and a bank of batteries are also provided with separate enclosures within the system enclosure.

6 Claims, 4 Drawing Sheets

OTHER PUBLICATIONS

"Stress dependent low-frequency electrical noise in carbon fibers"; Dinesh Patel et al.; Journal of Applied Physics; Sept. 1992; No. 5; pp. 1901–1905.

"1/f Noise and Grain–Boundary Diffusion in Aluminum and Aluminum Alloys"; R. H. Koch et al.; Physical Review Letters; vol. 55, No. 22; Nov. 1985; The American Physical Society; pp. 2487–2490.

"Direct link between 1/f noise and defects in metal films"; D. M. Fleetwood et al.; The American Physical Society; Jan. 1985; vol. 31, No. 2; pp. 1157–1160.

"Characterization of Probe Contact Noise for Probes Used in Wafer–Level Testing"; A. M. Yassine et al.; IEEE Electron Device Letters; vol. 12, No. 5; May 1991; pp. 200–202.

DUAL CHANNEL D.C. LOW NOISE MEASUREMENT SYSTEM AND TEST METHODOLOGY

CROSS REFERENCE TO RELATED APPLICATION

This application is a division of application Ser. No. 07/970,370 filed Nov. 2, 1992, now U.S. Pat. No. 5,434,385.

BACKGROUND OF THE INVENTION

1. Field of the Invention

The present invention generally relates to the detection of defects and the prediction of electromigration behavior of metal interconnects using an electrical noise technique, and, more particularly, to a dual channel D.C. noise system in which the system-induced noise level at a wide range of current and temperature conditions is significantly less than Johnson noise at all frequencies of interest.

2. Description of the Prior Art

As the cross-section of metal interconnects in integrated circuits continues to decrease and the resulting current density increases, failure of the metallization due to electromigration remains a concern. The susceptibility of metal interconnects to electromigration failure is conventionally evaluated by subjecting many samples to conditions of accelerated current and temperature until failure results in the form of an open or short (extrusion), e.g. a Median Time to Fail (MTTF) test. These results are then extrapolated to use-conditions. In addition to being destructive, this test can take weeks or even months to complete. This implies that if a problem with the metallization is uncovered with a MTTF test, there may be a large number of parts already manufactured that may be considered unsuitable for use.

Another factor that can limit the lifetime of metal interconnects is the presence of defects that may result from the manufacturing process. These defects (e.g. notches and scratches), reduce the cross-sectional area of the interconnect with a concomitant increase in current density, which may result in an early electromigration failure. Conventional measurements such as resistance are generally unable to detect the presence of these defects since, while a significant (e.g. likely to compromise performance of the circuit over a long period of service) notch or scratch may reduce the cross-sectional area of a conductor by 50% to 90%, the dimension of the notch or scratch along the length of the conductor is typically very short (e.g. much less than 1% of the length of the conductor).

It is therefore desirable to develop a technique that can evaluate the reliability of metal interconnects quickly and non-destructively. One technique that has received a great deal of attention recently is 1/f noise or, more generally, excess noise which characteristically varies as $1/f^\alpha$, where $\alpha$ usually lies in the range $0.7 < \alpha < 1.4$. Published reports have shown a correlation between interconnect reliability and excess noise [see for example, J. L. Vossen, Applied Physics Letters, Vol. 23, p. 287 (1973), M. I. Sun, et al., 10th International Conference on Noise in Physical Systems, L Budapest, Hungary, p. 519 (1989), Z. Celik-Butler, et al., Solid-State Electronics, Vol. 34, No. 2, p. 185 (1991), M. L. Dreyer, MRS Symposium Proc., Vol. 225, p. 59 (1991)].

One problem with most noise measurement systems is that the background, or system-induced, noise exceeds the Johnson noise, sometimes referred to as thermal noise, of the device under test. This background noise prohibits the accurate measurement of samples with excess noise close to Johnson noise. The magnitude of this background noise is generally observed to increase as the frequency decreases in the same manner as the excess noise of interest, whereas the Johnson noise is independent of frequency [see for example, A. Diligenti, et al., IEEE Electron Device Letters, Vol. EDL-6, No. 11, p. 2487 (1985), T. M. Chen, et al., IEEE IRPS, p. 87 (1985), G. M. Gutt, et al. IEEE Southeastcon Proc., p. 1305 (1989), D. M. Liou, et al., Japanese Journal of Applied Physics, Vol. 29, No. 7, p. 1283 (1990), W. Yang, et al., IEDM Proceedings, p. 681 (1989), J. Komori, et al., IEEE International Conference on Microelectronic Test Structures, Vol. 4, No. 1, p. 257 (1991), J. A. Schwarz,.et al., J. Appl. Phys., Vol. 70, No. 3, p. 1561 (1991)]. In other words, if the noise of the measurement system is too high it will mask the excess noise (above the Johnson noise) of the device under test. Minimizing the background noise of the measurement system is especially important for the study of excess noise in metal interconnects since the excess noise magnitude tends to be only a factor of 10 to 100 above the Johnson noise at 1 Hz.

SUMMARY OF THE INVENTION

It is therefore an object of the present invention to provide a testing environment for the measurement of 1/f noise in metal interconnects which is sufficiently quiet to permit accurate measurements of the noise at levels near Johnson noise.

It is a another object of the invention to provide for reliable prediction of electromigration properties of metal films of differing microstructures and aluminum films, in particular.

It is a further object of the invention to provide for detection of variation in cross-sectional area of electrical connections which may be subject to degradation through electromigration.

In order to accomplish these and other objects of the invention, a system for measuring 1/f noise is provided including a system enclosure having at least one of electrical shielding and magnetic shielding, a sample enclosure within the system enclosure having at least one of electrical shielding and magnetic shielding, a sample oven having at least magnetic shielding and including a low noise heater within the sample enclosure, an arrangement for applying electrical bias to a sample enclosed within the sample oven, and a shielded communication link to a dynamic signal analyzer.

In accordance with another aspect of the invention, a method of evaluating the mean time to failure of an electrical component is provided including the steps of measuring the frequency dependent component of noise in the component under operational conditions of the component, evaluating the term $\alpha$ in the expression of $1/f^\alpha$ as an expression of the frequency dependent component of noise measured in said measuring step, and estimating the mean time to failure as a function of the value of $\alpha$.

In accordance with a further aspect of the invention, a method of detecting presence of defects of an interconnection in an electronic component is provided including the steps of measuring a frequency dependent component of noise of a defect free sample of an electronic component, measuring a frequency dependent component of noise of another sample of an electronic component, and determining the presence of a defect by detection of a difference in results of said measuring steps being greater than at least an order of magnitude.

In accordance with a yet another aspect of the invention, a method of monitoring electromigration of a connection in an electronic component is provided including the steps of electrically stressing said connection, and monitoring changes in a frequency dependent component of noise in said electrical connection over a predetermined period of time.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
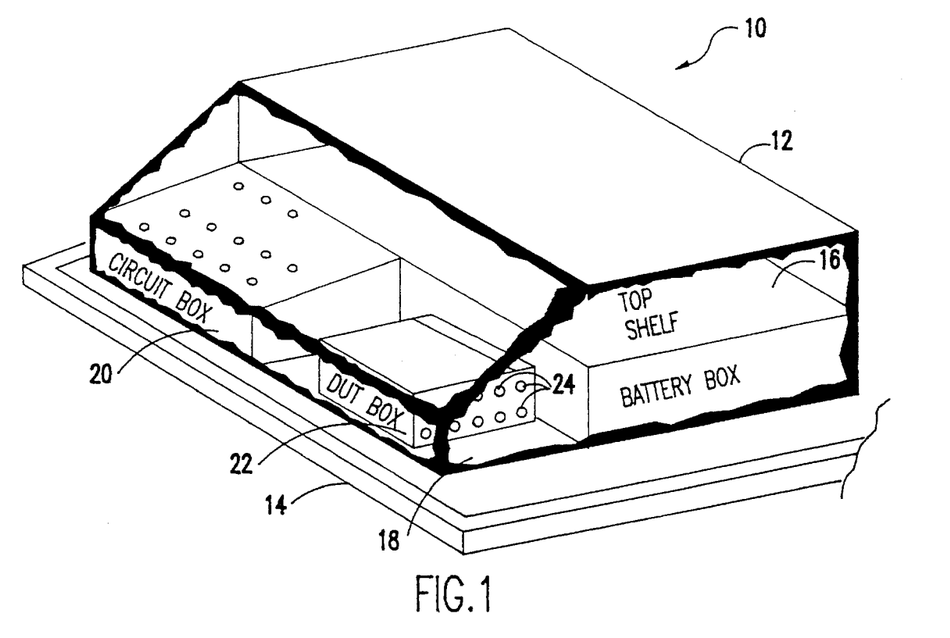
FIG. 1 is an isometric, cut-away view of a testing enclosure in accordance with a preferred embodiment of the invention.

Referring now to the drawings, and more particularly to FIG. 1, there is shown a partially cut-away view of the test enclosure in accordance with the invention. The entire system 10, except for a commercially available dynamic signal analyzer, is enclosed in a ¼" thick brass box 12 measuring approximately 30"×30"×16" which is completely lined with Mu metal. The entire enclosure is on an active air table 14. The purpose of the enclosure 12 and air table 14 is to minimize external electrical, magnetic and mechanical interference. The various components of the system are preferably arranged within the enclosure as shown.

Specifically, the top shelf 16 holds two low-noise preamplifiers and two matching low-noise transformers, both of a commercially available type and which will be described in further detail below in regard to FIG. 3. The lower shelf 18 contains sealed lead-acid batteries in a rear section thereof. Ten six cell shrink packages are preferably used in the present system, yielding a maximum potential of 130 volts, although the voltage available is not critical to the practice of the invention. A circuit box includes a lower left front compartment which contains part of the system biasing circuit that will be described in detail below in connection with FIG. 3. A D.U.T. box is preferably located in the front lower right of the bottom shelf 18. The D.U.T. box which is also of ¼ inch thick brass is preferably approximately 5"×7"×8" and has 28 BNC connections 24 on an outer surface thereof. The top is preferably hinged for access to a sample holder and oven as shown in greater detail in FIG. 2.

Figure 2:
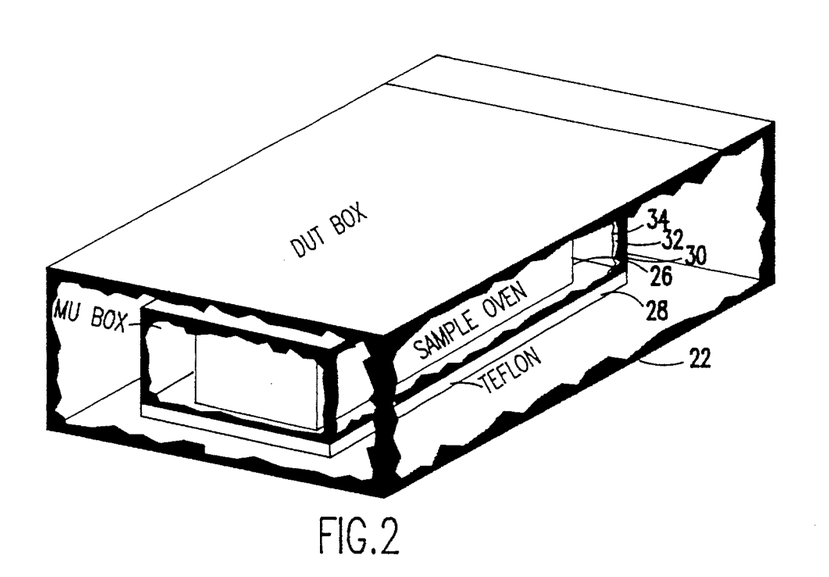
FIG. 2 is an isometric cut-away detail of the D.U.T. box and sample oven of the testing enclosure of FIG. 1.

The sample oven 26 inside the D.U.T. box 22 is preferably also made of ¼" thick brass approximately 1 ¾"×2 ½"×3 ½". This oven box 26 rests on a ½" thick TEFLON™ square 28 through which wires of coaxially shielded cable (not shown) pass from a 28 pin dual in-line package (DIP) socket which serves as a sample holder within the oven box to the D.U.T. box connectors 24. It is to be understood that other numbers of pins and pinout patterns could be similarly provided. The TEFLON™ thermally isolates the oven box 26 from the D.U.T. box 22 and provides strain relief for the coaxial cables. The coaxial cables are preferably connected to the DIP pins by high temperature solder.

Heat is preferably generated by five 10 ohm, 10 watt wirewound resistors 36 that are glued to the DIP socket 38 (shown in FIG. 3) with a high temperature resistant adhesive. Wire wound resistors are preferred as heating elements since wire wound resistors do not introduce 1/f noise or interfere with measurement of 1/f noise of a D.U.T. at current levels of interest (e.g. less than about one Ampere per resistor) for generation of adequate heat. For example, 0.8 Amperes per resistor is a nominal maximum current needed for the production of adequate temperatures with the preferred array of heater resistors noted above, while introducing no measurable 1/f noise. Therefore, heating and high accuracy of temperature can be maintained during testing and temperature drift techniques (e.g. heating the sample to a temperature above the test temperature and allowing it to cool through the test temperature during the test), common in the prior art, need not be resorted to.

Power for the oven resistors is preferably supplied by a commercially available DC Power Supply. The temperature is monitored by two thermocouples of a commercially available type that are also glued to the DIP socket, centered about ¼ inch apart, with high temperature resistant adhesive. The thermocouples are connected to a commercially available digital thermometer. The top of the sample oven box 26 is hinged to allow access to the DIP socket.

The sample oven box 26 is surrounded with a Mu metal enclosure 30 that is lined with an insulator 32 and reflective foil 34. Thus the sample oven box 26 and the enclosure 30 provides two separate enclosed air spaces and a substantial number of reflective and insulating interfaces. This arrangement allows a sample temperature of up to 250° C. to be obtained from the wire wound resistor heating elements with a drift of only ±0.2° C. during the measurement.

Figure 3:
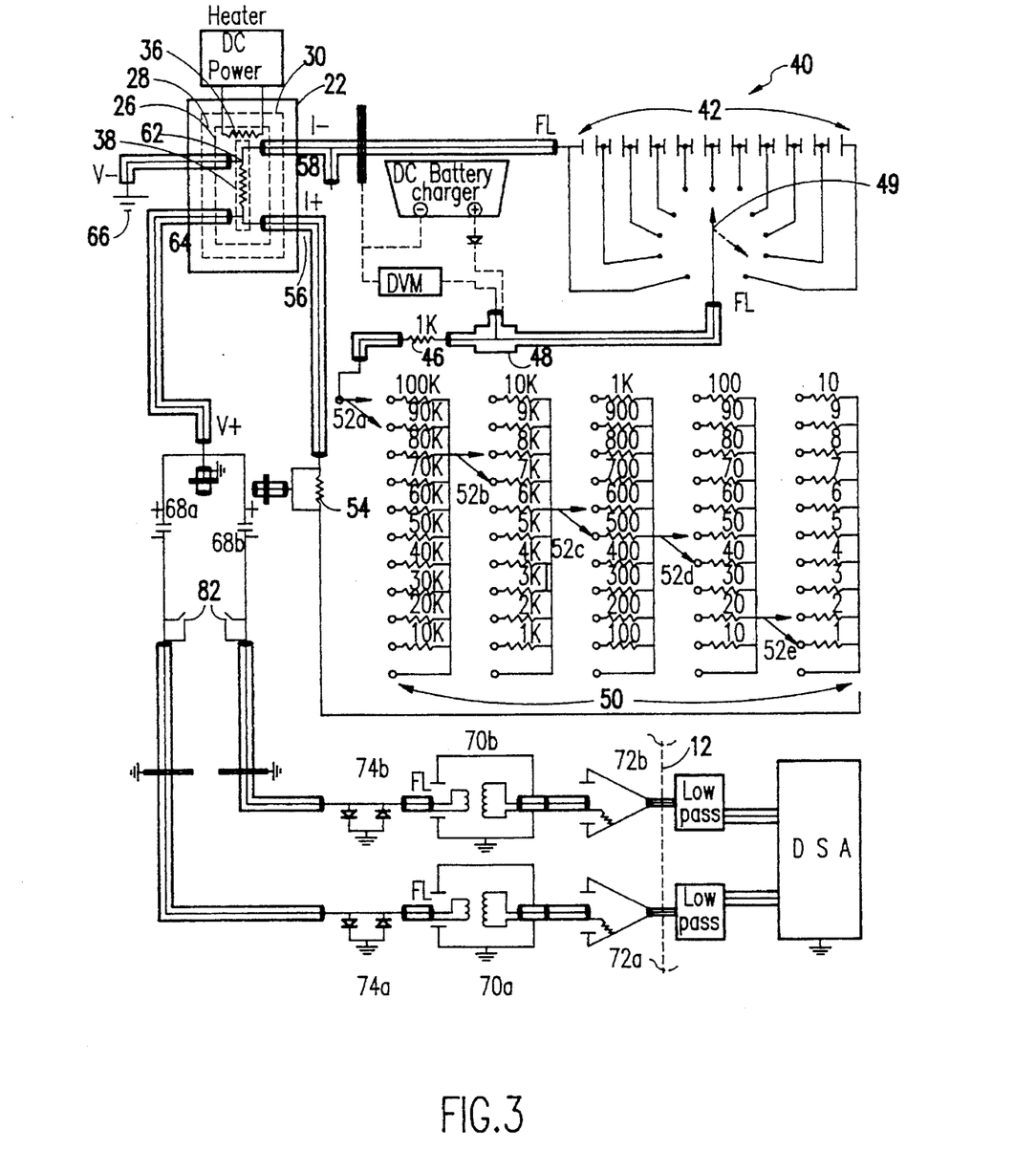
FIG. 3 is a schematic diagram of the dual channel current supply in accordance with the invention, and FIGS. 4, 5, 6 and 7 graphically depict the effectiveness of the electrical, magnetic and mechanical shielding in accordance with the invention.

The biasing circuit 40 for applying an electrical current to the sample is schematically shown in FIG. 3. It is preferred that all electrical connections are soldered wherever possible. The sealed lead-acid batteries 42 are connected in series and selectively tapped at a desired voltage by means of a 15 ampere rated, silver plated rotary power switch 44. A 1000 ohm 10 watt wirewound resistor 46 is placed in series to assure a large and 1/f noise free ballast resistance. A BNC barrel connector 48 is included between the ballast resistor 46 and the rotary switch 44 to allow for battery recharging.

The appropriate current for the test of the sample is obtained by five wirewound resistor ladder chains 50 connected in series. Each one consists of ten wire wound resistors (10 watts) connected in parallel. Resistor selection in each ladder is made by a silver plated rotary switch 52a, 52b, 52c, 52d, 52e, similar in construction to rotary switch 44. A wire wound current measurement resistor 54, preferably having a resistance of 100 ohms, is placed in series between the resistor ladders 50 and the D.U.T. I+ tap 56 in order to monitor the current. The I– tap 58 from the D.U.T. is connected to the batteries' negative lead.

The D.U.T. V– tap 62, corresponding to the I+ battery connection, is connected to case ground 66. The V+ leg 64 is then provided with a monitoring port and divided into two identical channels. Each channel includes a large capacitance to prevent damage to the low-noise transformers 70a, 70b. This capacitance, preferably includes twelve 1800 µF, 100 volt capacitors connected in parallel, indicated at 68a and 68b. Each capacitor is subsequently connected to a low noise transformer 70a, 70b, matching low noise preamplifiers 72a, 72b, and diode overvoltage protection circuits 74a, 74b. The diode circuit protects the transformers from damage should a sample open under test. It is useful to provide a set of switches 82 that prevent the transformers from receiving any current during bias adjustment.

The preamplifiers are preferably operated on rechargeable Ni - Cad batteries. The output of the two preamplifiers is preferably brought out of the enclosure 12 by 50 ohm coaxial cable to commercially available low pass filters and then to a dynamic signal analyzer (DSA). Similar 50 ohm coaxially shielded cable is used throughout the biasing circuit 40 and preferably terminated as illustrated; floating portions of the shielding being indicated by the legend "FL". While terminations of the shielded cables are important to the practice of the invention, the particular terminations shown may be varied somewhat, particularly with changes in the layout and specific structure of the nested enclosures 12, 20, 22, 26 and 30 within the scope of the invention.

Figure 4:
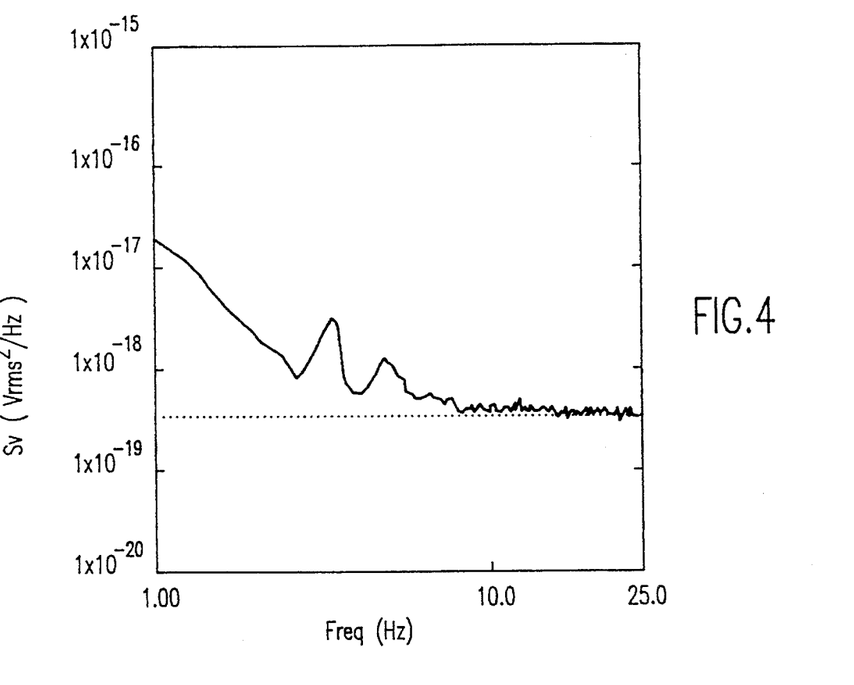
Figure 5:
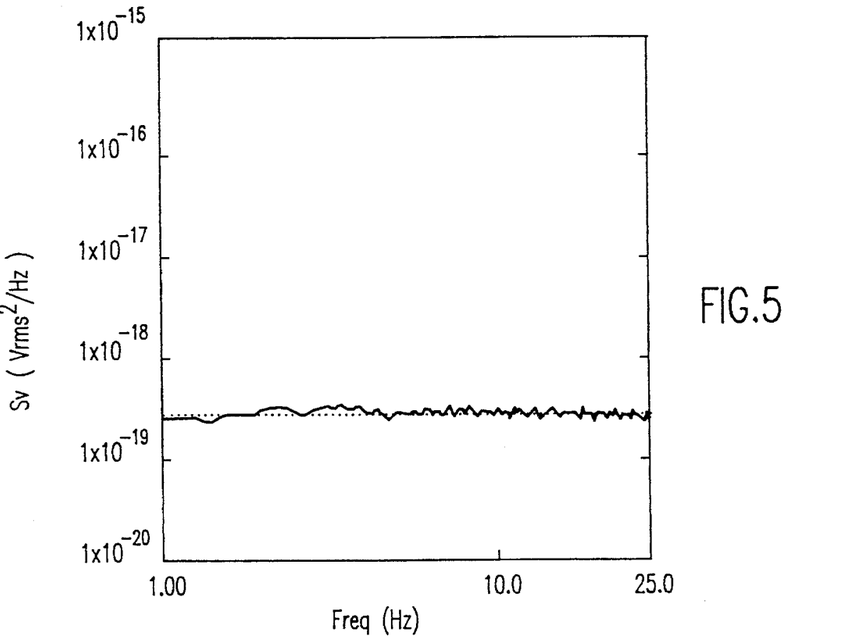
Figure 6:
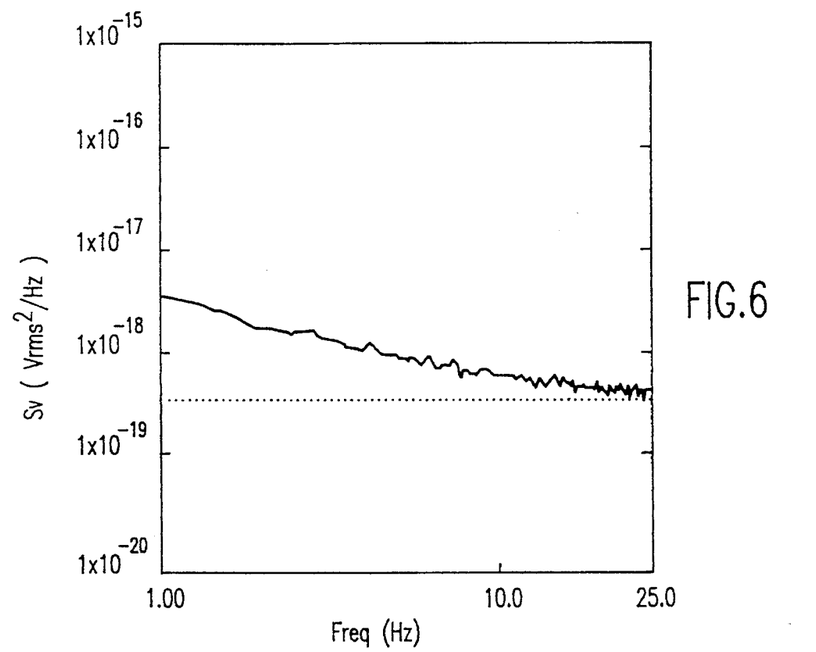
Figure 7:
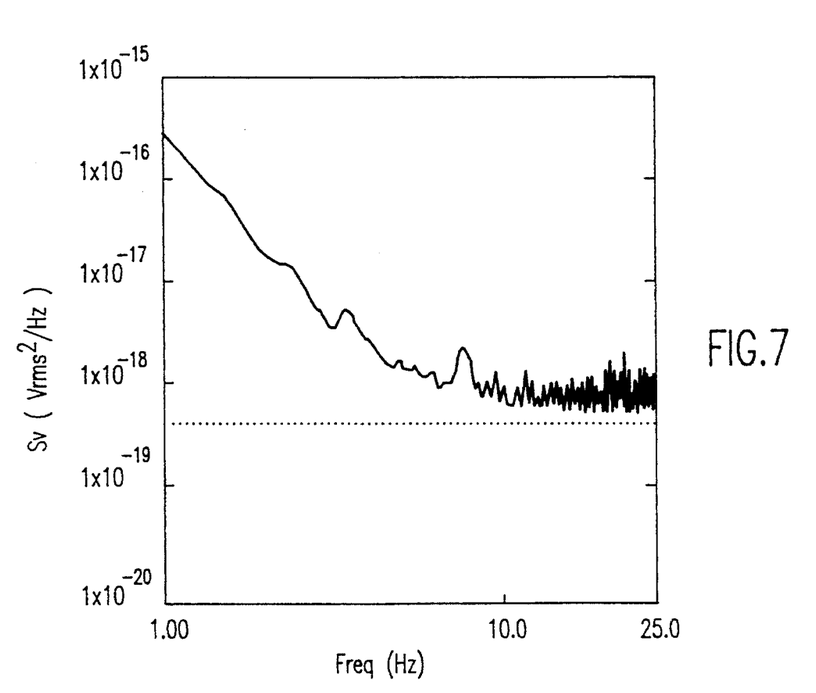

In summary, the nested enclosures provide electrical, magnetic, and mechanical shielding which is suitable to produce an environment which is sufficiently quiet for reliable and repeatable measurements of 1/f noise in thin metal films. The effectiveness of this enclosure may be seen from a comparison of FIGS. 4 and 5. In both figures the 1/f noise is measured in a 20 ohm wire wound resistor at room temperature using a current of 10 mA. As indicated above, wire wound resistors are known to be free of any significant 1/f noise. Therefore the measured noise should ideally be frequency independent, with the magnitude of the noise equal to the Johnson noise for the particular resistance and temperature. FIG. 4 shows the result of such a measurement obtained without the electrical, magnetic, or mechanical isolation. It can be seen that the magnitude of the noise is not frequency independent, but generally increases as the frequency decreases. The resulting noise magnitude at 1 Hz is approximately 100 times higher than Johnson noise. In contrast, FIG. 5 demonstrates the results of a similar measurement that utilizes the invention. In this Figure the power spectrum is frequency independent with a magnitude equal to the Johnson noise. This Figure shows that the invention is highly effective in providing a test environment which is virtually free from 1/f noise. In regard to the repeatability of the measurement, the noise of a 20 ohm wire wound resistor at room temperature was measured over a period of five months at currents ranging from 1 to 86 mA. To a 95% confidence level the magnitude of the noise was within 5% of Johnson noise. This result shows the high degree of repeatability that is achieved with the invention. In addition, FIGS. 6 and 7 show the 1/f noise of a 1000 Å thick aluminum stripe measured at room temperature with a current of 5.8 mA (20 mA/$\mu m^2$) with and without the invention, respectively. In FIG. 6 it can be seen that the noise magnitude of the aluminum stripe clearly exceeds the Johnson noise. However, FIG. 7 shows that the noise of the sample can be hidden by the large background noise of the measurement system due to insufficient shielding. These Figures clearly show the ability of the invention to measure the 1/f noise in thin metal films in which the magnitude of the noise is relatively close to Johnson noise.

As examples of the effectiveness of the invention, some exemplary measurements of sample conductors will now be described. As indicated above, the invention uses low noise measurements to detect voids, notches and other defects in thin metal films due to film processing, thermal cycling and time dependent defect generation mechanisms, i.e., electromigration and stress migration. In addition this invention can detect differences in films with different microstructures. With the quiet testing environment provided by the invention, quantitative and repeatable 1/f noise measurements can be performed.

For example, a notch was intentionally induced in a connection having a total length of 7432 $\mu m$ and a thickness of 1.5 $\mu m$. The width varies from 1.6–4.2 $\mu m$. The 1/f noise was measured before and after a notch was induced using a gallium focused ion beam. The notch was made in an area that was 2 $\mu m$ in width. The notch was approximately 0.8 $\mu m$ in width, and the width of the remaining metal was approximately 0.2 $\mu m$. Introduction of the notch did not change the resistance, but the noise increased by 4.5×.

As another example, electromigration induced voids have been detected in pure aluminum lines having dimensions of 2.5 $\mu m \times 0.85$ $\mu m \times 2000$ $\mu m$. These lines were subjected to electromigration stress conditions of 10 mA/$\mu m$ and 225° C. The samples were periodically removed from stress and the 1/f noise was measured at room temperature. The 1/f noise measurement was able to easily detect the formation of electromigration induced voids which were not detectable by resistance measurements. To confirm the formation of voids by electromigration, the experiment was continued until the voids caused the resistance to increase by approximately 1.05×. At this point, the 1/f noise increased by at least 10,000×.

As a further example, 1/f noise measurements were made on pure aluminum stripes with dimension 1.8 $\mu m \times 1.0$ $\mu m \times 254$ $\mu m$. A scratch in an as-received sample caused the noise to be approximately 5 orders of magnitude higher than the other undamaged samples. The resistance measurement of the sample gave no indication of the existence of the scratch. Therefore, it is seen that a wide latitude of detection capacity is provided by the present invention and detection of changes in 1/f noise of about one order of magnitude would be sufficient to detect variation of cross-sectional area of conductors smaller than could be considered to be defects (e.g. those variations in cross-sectional area which would behave in a manner which is likely to compromise the performance of the device over a long period of service).

The system in accordance with the invention has also been able to detect the difference between groups of aluminum stripes with identical grain size and grain size distribution but with differences in crystallographic texture. In this experiment sputtered films having low volume fraction (58%) of (111) texture and low MTTF (29 hours) exhibited higher alphas $\alpha$ being the slope of the 1/f noise when plotted against a logarithmic frequency scale, e.g. $1/f^\alpha$) than films having high volume fraction (78%) of (111) texture and high MTTF (772 hours) which were prepared by partial ionized beam (PIB). These results indicated that the sputtered films had lower reliability than the PIB films and an inverse functional relationship between the magnitude of $\alpha$ and the MTTF. Therefore, based on empirical data and by virtue of the consistency of quantitative measurements enabled by low-noise environment of the present invention, a qualitative evaluation of the MTTF may be made based on the value of $\alpha$ obtained when the expression $1/f^\alpha$, descriptive of the frequency dependent component of the measured noise, is evaluated (e.g. by determining an approximation of the slope of the noise spectrum). Noise measurements allowed us to obtain these results in a few days, whereas traditional electromigration testing took approximately two months to reach the same conclusion.

In summary, the inventors have devised a test system in which the background noise of the system is immeasurably small over a wide range of currents and temperatures. The low background noise of the test system allows one to perform quantitative studies of the 1/f noise in thin metal films at noise levels relatively close to Johnson noise. In the examples that were provided it was demonstrated that 1/f noise measurements performed with the invention are able to detect the presence of defects and to distinguish between sets of films with different microstructures. It was also shown that the electromigration lifetime (MTTF) of a set of films is inversely proportional to alpha.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of evaluating the mean time to failure of an electrical component including the steps of:

measuring the frequency dependent component of noise in the electrical component under conditions in which the electrical component was designed to operate, evaluating the term $\alpha$ in the expression of $1/f^{\alpha}$ as an expression of the frequency dependent component of noise measured in said measuring step, and estimating the mean time to failure as a function of the value of $\alpha$.

2. A method of detecting presence of defects of an interconnection in an electronic component including the steps of:

measuring a frequency dependent component of noise of a defect free sample of an electronic component, measuring a frequency dependent component of noise of a second sample of an electronic component, and determining the presence of a defect in said second sample by detection of a difference in results of said measuring steps being greater than at least an order of magnitude.

3. A method of evaluating a physical parameter of an electrical component including the steps of:

applying at least one of thermal and electrical stress to at least a portion of said electrical component; and measuring a noise in said electrical component having a spectrum of the form $1/f^{\alpha}$, where f is frequency and $\alpha$ is a slope of said spectrum.

4. A method of evaluating a physical parameter of an electrical component including the steps of:

applying at least one of thermal and electrical stress to at least a portion of said electrical component; and measuring a frequency dependent component of noise in said electrical component, evaluating the term $\alpha$ in the expression of $1/f^{\alpha}$ as an expression of the frequency dependent component of noise measured in said measuring step;

and estimating the mean time to failure as a function of the value of $\alpha$.

5. A method of evaluating a physical parameter of an electrical component including the steps of:

applying at least one of thermal and electrical stress to at least a portion of said electrical component; and measuring a frequency dependent component of noise in said electrical component, measuring a frequency dependent component of noise of a defect free sample of an electronic component; and determining the presence of a defect by detection of a difference in results of said measuring steps being greater than at least an order of magnitude.

6. A method of evaluating a physical parameter of an electrical component including the steps of:

applying at least one of thermal and electrical stress to at least a portion of said electrical component; and measuring a frequency dependent component of noise in said electrical component, monitoring changes in a frequency dependent component of noise in said electrical component over a predetermined period of time.

* * * * *

UNITED STATES PATENT AND TRADEMARK OFFICE
CERTIFICATE OF CORRECTION

PATENT NO. : 5,563,517
DATED : October 8, 1996
INVENTOR(S) : Glenn A. Biery; Daniel M. Boyne; Kenneth P. Rodbell; Richard G. Smith and Michael H. Wood It is certified that error appears in the above-indentified patent and that said Letters Patent is hereby corrected as shown below:

Column 7, Claim 1, Line 22, please delete "$1/\alpha$" and please insert --$1/f^\alpha$--.

Signed and Sealed this

Eighth Day of July, 1997

Attest:

Attesting Officer

BRUCE LEHMAN

Commissioner of Patents and Trademarks